(12) United States Patent
Meron et al.

(10) Patent No.: US 6,783,299 B2
(45) Date of Patent: Aug. 31, 2004

(54) LATCH FOR DETACHABLY ATTACHING AND MOUNTING A SEMICONDUCTOR WAFER TO A SUPPORT RING

(76) Inventors: Ovadia Meron, 3 Poddock Ct., Brookville, NY (US) 11545; Dmitriy Genkin, 1935 Shore Pkwy., #2H, Brooklyn, NY (US) 11214

( * ) Notice: Subject to any disclaimer, the term of this patent is extended or adjusted under 35 U.S.C. 154(b) by 0 days.

(21) Appl. No.: 10/138,185

(22) Filed: May 2, 2002

(65) Prior Publication Data

US 2002/0167122 A1 Nov. 14, 2002

Related U.S. Application Data

(63) Continuation-in-part of application No. 09/905,364, filed on Jul. 13, 2001, now Pat. No. 6,536,755, which is a continuation of application No. 09/361,783, filed on Jul. 26, 1999, now Pat. No. 6,299,153.

(51) Int. Cl.$^7$ .................................................. F16D 7/00
(52) U.S. Cl. .................... 403/325; 411/371.2; 411/544; 269/91; 451/365
(58) Field of Search .............................. 403/325, 408.1, 403/373, 374.1, 374.2, 321, 322.1; 411/155, 156, 371.2, 544; 269/903, 128, 135, 150, 91; 451/365

(56) References Cited

U.S. PATENT DOCUMENTS

| 4,473,455 | A | | 9/1984 | Dean et al. |
|---|---|---|---|---|
| 4,971,676 | A | | 11/1990 | Doue et al. |
| 5,401,354 | A | | 3/1995 | Colucci |
| 5,700,297 | A | | 12/1997 | Vollaro |
| 5,785,307 | A | | 7/1998 | Chung |
| 6,010,094 | A | | 1/2000 | Csik et al. |
| 6,143,147 | A | * | 11/2000 | Jelinek ................. 204/298.15 |
| 6,258,228 | B1 | * | 7/2001 | Reiss .................... 204/298.15 |
| 6,299,153 | B1 | * | 10/2001 | Meron et al. .............. 269/128 |
| 6,536,755 | B2 | * | 3/2003 | Meron et al. ................ 269/91 |

* cited by examiner

*Primary Examiner*—Lee D. Wilson
(74) *Attorney, Agent, or Firm*—Carella, Byrne, Bain, Gilfillan et al.; John N. Bain; William Squire (57) ABSTRACT

A plurality of latches are employed for detachably holding a semiconductor wafer to a ring support during processing. Each latch is rotatably mounted on a post which is secured to the ring so that it can move to engage and disengage the wafer, alternately clamping and releasing it from the ring. Each latch has two opposed rollers, one to engage and disengage the wafer and the other to engage the ring. The latches should be freely rotatable into and out of engagement with the wafer. The ring usually has two pairs of opposed dimples such that each roller is in registration with each of the opposed dimples of each pair when it rotates from the engaged to the disengaged position and visa versa. The dimple in registration with the roller when engaged the wafer is sufficiently deep so that the roller does not touch the ring when clamped to the wafer. In that position, the opposing dimple is dimensioned so that the opposite roller in registration therewith engages the bottom of the dimple, tilting the latch to engage and clamp the wafer to the ring.

22 Claims, 6 Drawing Sheets

PRIOR ART

PRIOR ART

100 ## LATCH FOR DETACHABLY ATTACHING AND MOUNTING A SEMICONDUCTOR WAFER TO A SUPPORT RING

This application is a continuation-in-part of application Ser. No. 09/905,364 filed Jul. 13, 2001 now U.S. Pat. No. 6,536,755, which is a continuation of Ser. No. 09/361,783 filed Jul. 26, 1999, now U.S. Pat. No. 6,299,153, both of the aforementioned applications being incorporated by reference in their entirety.

BACKGROUND OF INVENTION

This invention is related to clamping latches rigidly mounted on a supporting member and pivotal into and out of engagement with a work-piece in a high temperature environment contaminated by very small particulate debris. More specifically the present invention is related to a latch for clamping a semiconductor wafer to a support ring during processing including plasma vapor deposition and sputtering.

Typically, semiconductor wafers are detachably mounted to a ring support member during processing. A plurality of latches mounted proximal to the periphery of the ring support member resiliently bias the wafer against a portion of the ring more distal there from.

Each latch is provided with a first freely rotating engagement member extending radially inwardly from the point of engagement of the latch with the ring for resilient and rolling engagement with a peripheral portion of the wafer. The latch is also provided with a second freely rotating engagement member extending radially outwardly from the point of engagement of the latch with the ring for resilient and rolling engagement with a peripheral portion of the ring support member.

The latch is pivotally secured to the ring support member for rotation about an axis normal to the axis of rotation of the first and second rotating engagement members. Pivoting the latch moves the second rotating engagement member into and out of engagement with the wafer. Unintended pivotal movement of the latch is resisted by engagement of the second rotating engagement member with a well or depression in the peripheral surface of the ring when the first rotating engagement member is not engaged to the wafer. When the second rotating engagement member is engaged to the wafer, a depression or concavity in the ring member secures the latch against unintended pivotal movement but also provided for resilient biasing of the latch against the wafer.

The most recent prior art includes such latches as shown in U.S. Pat. No. 6,299,153 issued to the inventors of the present invention on Oct. 9, 2001 and U.S. Pat. No. 6,143,147 issued to Vaclav Jalinek on Nov. 7, 2000.

The inventors of the present invention found that the first and second engagement members of the latch shown in U.S. Pat. No. 6,143,147 experienced binding due to work wear and other work conditions. Such binding of the second engagement members resulted in surface damage to the wafer when the latch was pivotally rotated from an engagement to disengagement position or visa-versa. Moreover, binding of the first engagement member resulted in excessive resistant and even failure of the latch to properly pivot. In their U.S. Pat. No. 6,299,153, the inventors of the present invention called for the use of ball bearings on one or more of the first engagement member, second engagement member and the pivotal attachment of the latch to the ring.

The ball bearing design shown in U.S. Pat. No. 6,143,147 has experienced failure including binding of the ball bearings and fracture of the latch body engaged to the ball bearings. The present invention is directed to a novel design of the latch body and ball bearing mechanism providing pivotal movement of the latch on the ring support.

It is among the objects and advantages of the invention shown and claimed herein to provide a latch and ball bearing assembly which includes a fail-safe feature to prevent binding of the pivotal movement of the latch.

It is a further object and advantage of the present invention to provide a latch and ball bearing assembly which will not suffer from fracture at the point of engagement of the balls of the bearing with the latch.

It is yet another object and advantage of the present invention to provide a latch assembly in which the ball bearing assembly providing pivotal movement for the latch may be quickly and easily removed and replaced as a unit.

It is still another object and advantage of the present invention to provide a latch and ball bearing assembly in which the balls of the ball bearing do not engage the latch body eliminating the requirement for tight tolerances between the balls and the body of the latch and the need for a tungsten carbide retaining washer required in the prior art assembly.

These objects and advantages as well as other objects and advantages may be achieved by the latch claimed herein, one embodiment of which is described and shown in the specification and drawings.

SUMMARY OF INVENTION

A latch for releasably holding a semiconductor wafer to wafer supporting means including means for rotatably mounting a latch body on wafer supporting means, said means including, a ball bearing having an inner race and an outer race, the inner race being rotatably on the mounting means, the outer race being rotatably if the inner race becomes non-rotatable, resilient means between the ball bearing and the latch body normally biasing the ball bearing away from the latch body, and first retainer means on the mounting means for preventing the separation of the ball bearing from the mounting means and second retainer means on the mounting means for preventing the latch body from separating from the mounting means.

Figure 1:
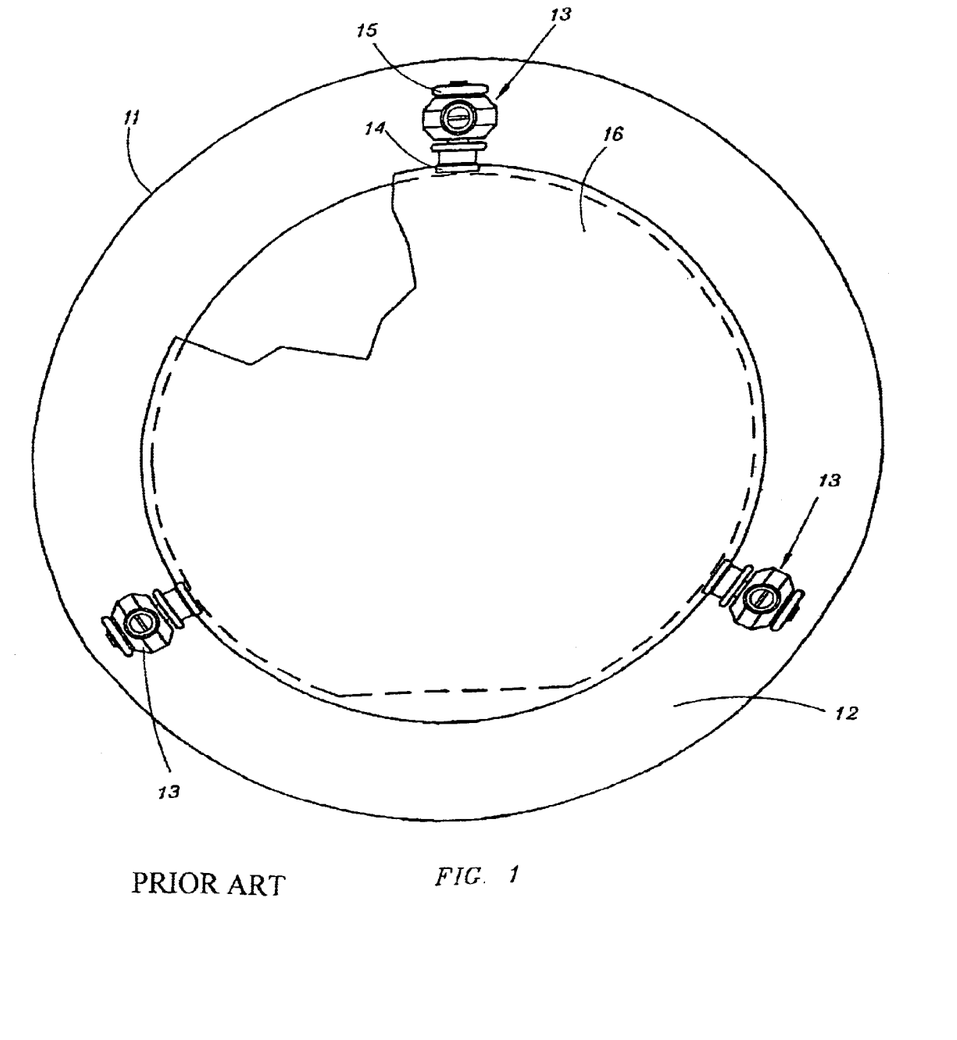
FIG. 1 is a top plan view of a typical mounting ring showing latches mounted on the ring adapted to operationally engage and disengage a semiconductor wafer ring to clamp it to and release it from the ring during processing.
Figure 2:
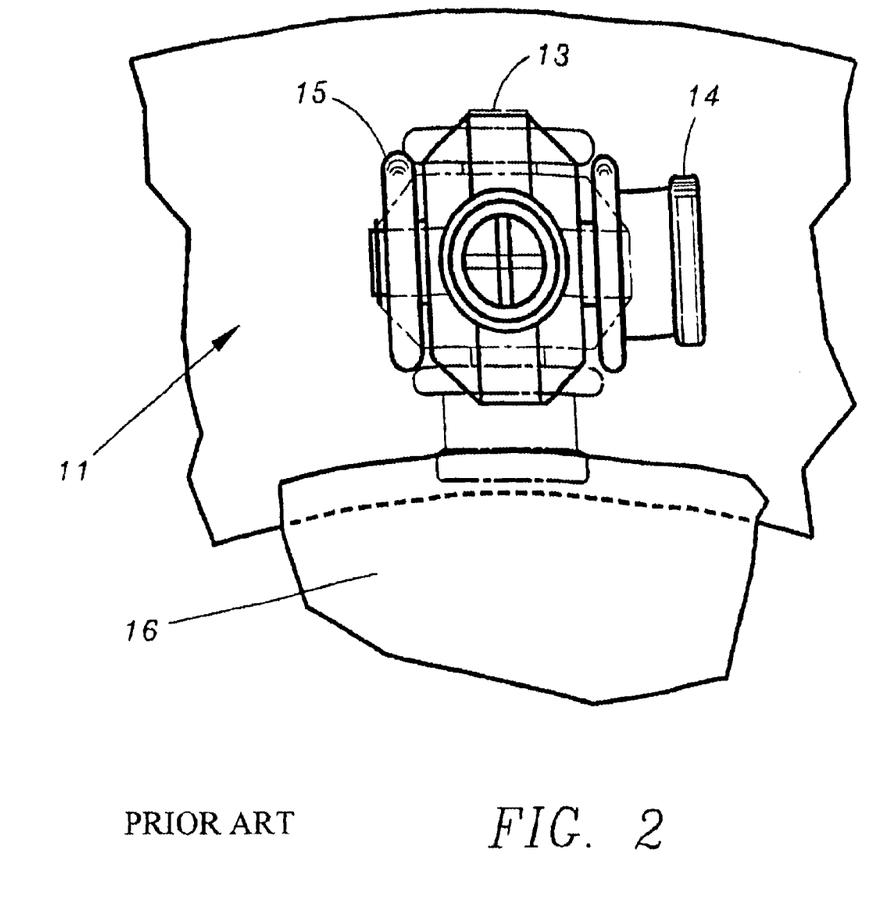
FIG. 2 is an enlarged top plan view of a portion of the ring shown in FIG. 1 with one latch mounted thereon with the latch in the clamping position shown in broken lines.

Referring to the drawings in detail, and more specifically to FIG. 1, a typical ring and latch assembly 11 is shown. The ring 12 is shown with latches 13, 13 mounted thereon for rotation in a plane normal to the plane of the ring 12. Each latch 13, now common in the prior art, has two rollers 14 and 15 mounted for rotation along an axis parallel and spaced away from the ring 11. Roller 14 is adapted to engage and disengage a semiconductor wafer 16 as shown in FIG. 2. with the engaged position shown in broken lines.

Figure 3:
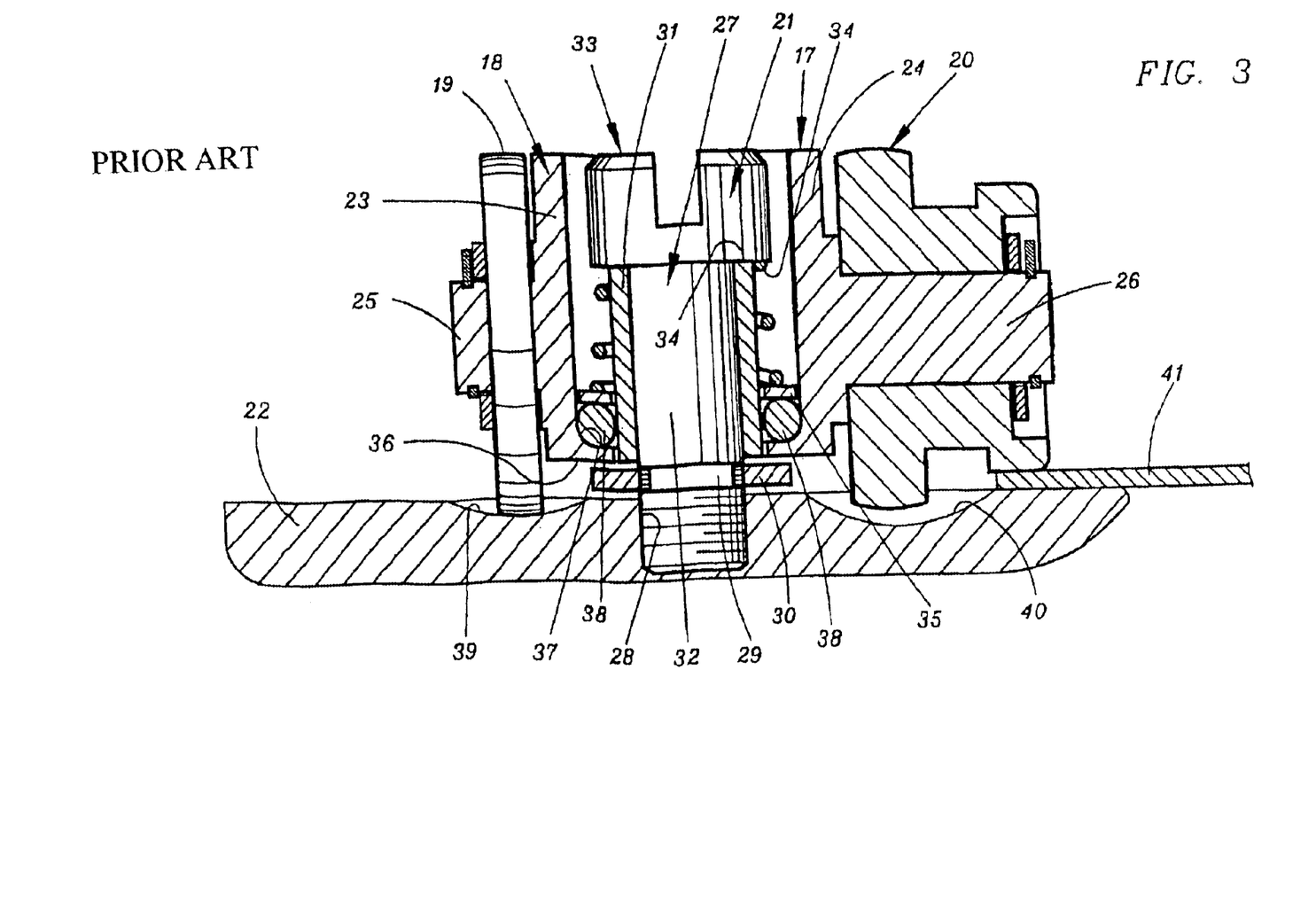
FIG. 3 is a side elevation, cross-sectional view of a prior art latch as shown in U.S. Pat. No. 6,143,147.

FIG. 3 shows a prior art latch as shown in U.S. Pat. No. 6,153,147. The latch 17 consists of a latch body 18, two horizontal rollers, 19 and 20 and a latch bearing assembly 21 to facilitate rotation of the latch body 18 in a plane normal to the plane of the ring 22. The body has opposed walls 23 and 24 defining a pair of coaxial shafts, respectively 25 and 26 on which rollers, respectively 19 and 20 are rotationally mounted. The rollers 19 and 20 are not provided with any bearings to facilitate rotation.

The latch bearing assembly 21 lies between the body walls 23 and 24 and consists of a mounting post 27 the lower end of which is treaded and adapted to threadably engage an internally threaded bore 28 in the ring 22. A first portion 29 of the post 27 above the ring 22 and a spacer 30 is shown as smooth. A collar 31 is shown as loosely mounted on a second smooth portion 32 of the post 27. The second smooth portion 32 is contiguous to and radially enlarged as compared to the first smooth portion 29.

The post 27 is provided with a slotted head 33 which engages both the top 34 of the collar 31 and the top of a biasing spring 34 compressed between the head 33 and a washer 35.

The bottom 36 of the body 18 is provided with an annular radius 37 to receive ball bearings 38, 38. The spring biased washer 35 resiliently biases the entire latch assembly 17 to the ring 22. The ring 22 is provided with concavities 39, 40. In the clamping position, roller 20 engages and clamps the wafer 41 to the ring 22. The opposite roller 19 engages the bottom of concavity 39 which is not as deep as concavity 40, thereby tilting the latch and providing a clamping action between roller 20 and the wafer 41.

In this prior art latch assembly it is virtually impossible to repair or replace the vertical bearing assembly, saving the latch body and horizontal rollers. Moreover, in a high temperature environment, the ball bearings tend to expand and crack the thin wall of the body at the radius.

Figure 4:
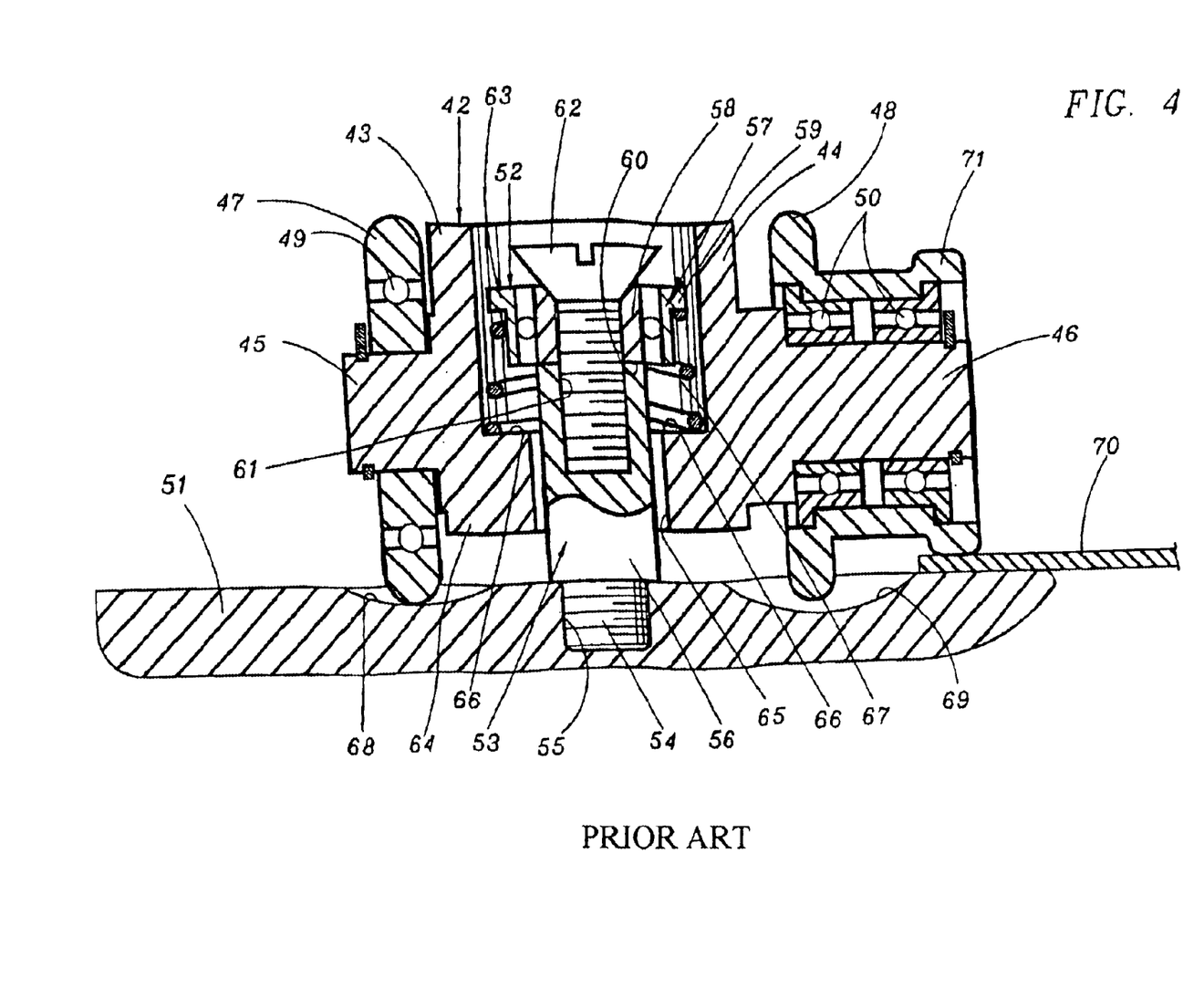
FIG. 4 is a side elevation, cross-sectional view of a prior art latch mounting bearing assembly as shown in U.S. Pat. No. 6,299,153 B 1.

Referring now to FIG. 4, there is shown the prior art latch shown in U.S. Pat. No. 6,299,153 B1. This latch includes a body 42 having a pair of opposed, spaced apart walls, 43 and 44 defining spaced apart, coaxial shafts 45 and 46. Rollers, 47 and 48 are mounted on the shafts 45 and 46 by ball bearings 49 and 50 for mounting the respective rollers.

The latch body 42 is rotatably mounted to a supporting ring 51 in a plane normal to the plane of the ring 51. A ball bearing assembly 52 is provided to facilitate the rotation of the latch body 42. The ball bearing assembly 52 consists of a post 53 the bottom of which is provided with external threads 54 for threadably engaging in an internally threaded bore 55 in the ring 51.

The post 53 has a smooth, radially enlarged portion 56 above the threads 54. A ball bearing 57, having an inner race 58 and an outer race 59 is mounted on the top 60 of the post 53. The top 60 of the post 53 has an axial, internally threaded bore 61. A flat head screw 62 passes through the inner race 58 of the ball bearing 57 and is threadably engaged within the bore 61. The outwardly and upwardly flaring wall of the flat head screw engages the inner race 58 of the ball bearing 57. A radially enlarged flange 63 is provided at the top of the outer race 59.

The bottom 64 of the latch body 42 is provided with a transverse opening 65 through which the post 53 extend upwardly from the ring 51 to the space between the spaced apart walls 43 and 44. The distance between the walls 43 and 44 adjacent to the post 53 is greater than width of the opening 65 in the latch body 42 defining a ledge 66.

A normally compressed coil spring 67 extends between the bottom of the flange 63 on the outer race 59 of the ball bearing 57 and the ledge 66. The spring 67 resiliently biases the latch body 42 to the ring 51.

The ring 51 is provided with a pair of opposed, spaced-apart concave concavities 68 and 69. Concavity 69 is deeper than concavity 68. When the latch is in the clamping position engaged to the wafer 70 as shown in FIG. 4, roller 47 is engaged to the ring at concavity 68 but roller 48 is not engaged to the ring 51 at concavity 69. The depth of concavity 68 and the diameter of the roller 47 are dimensioned such that engagement of roller 47 to the ring 51 at concavity 68 causes an outer portion 71 on the roller 48 to resiliently clamp the wafer 70 to the ring 51.

While the latch shown in FIG. 4 works well, if the ball bearing 57 locks so that the outer race 59 cannot rotate freely with respect to the inner race 58 rotational movement of the latch body 42 with respect to ring 51 defeating the purpose for providing a ball bearing to facilitate such rotation. The present invention provides for a fail-safe construction to prevent freezing vertical rotation of the latch should the bearing freeze.

Moreover, the post with the entire latch assembly still connected to it cannot be removed from the ring 51. Rather, the screw 62 must first be removed from the post 53. The bearing 57 must then be lifted off of the top of the post 53 which may or may not bring the spring 67 with it. Then, the post 53 can be unscrewed from the ring 51. However, there is no screw slot or other means on the post 53 to unscrew it so that it must normally be grasped by pliers for unscrewing which is undesirable. Moreover, the latch has been disassembled into four (4) pieces, three of which are very small, difficult to handle and move or store separately. It would be more desirable to remove the post from the ring with the latch assembly in tact attached to the post for rapid replacement and ease of handling.

Figure 5:
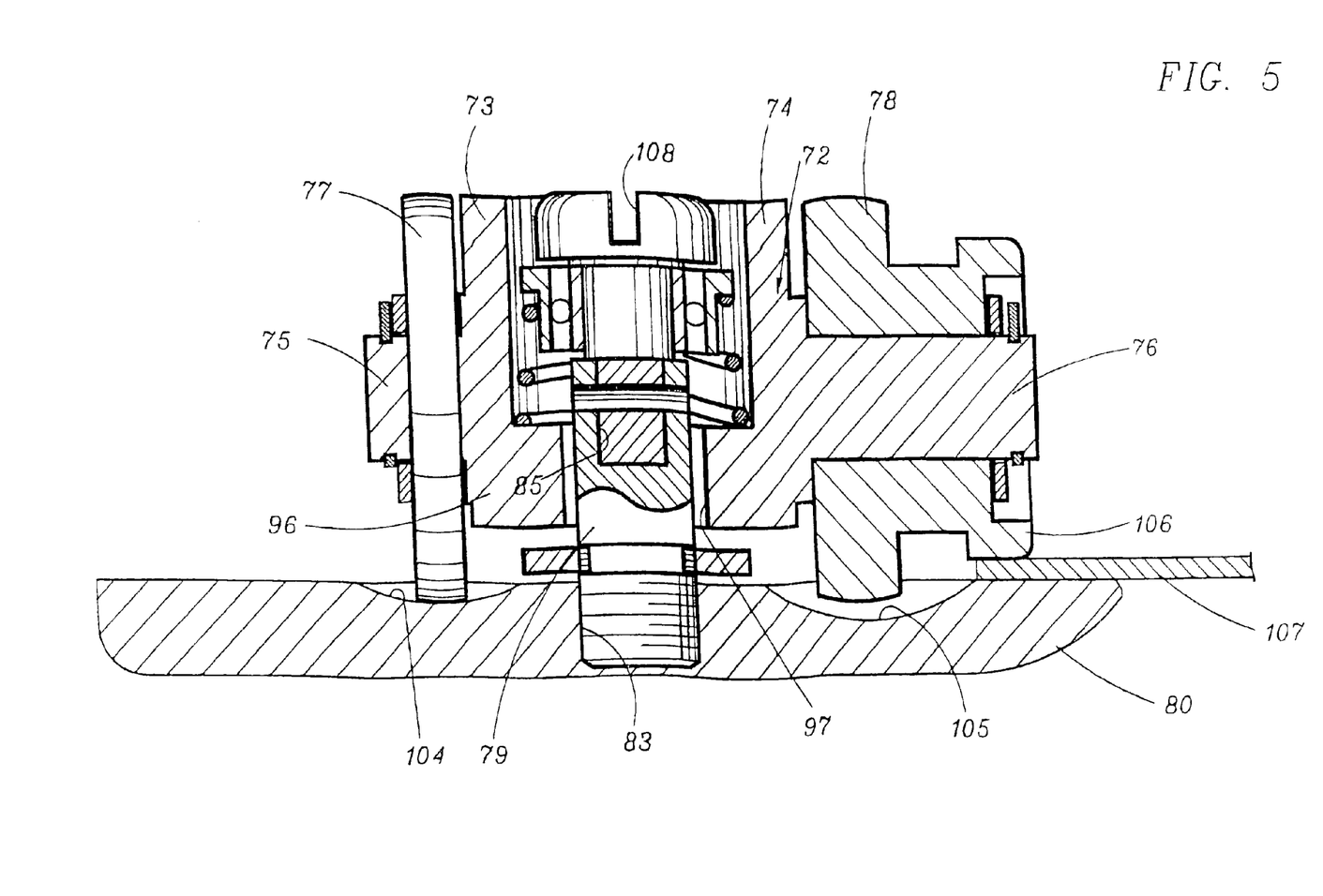
FIG. 5 is a side elevation, cross-sectional view of the latch of the present invention.
Figure 6:
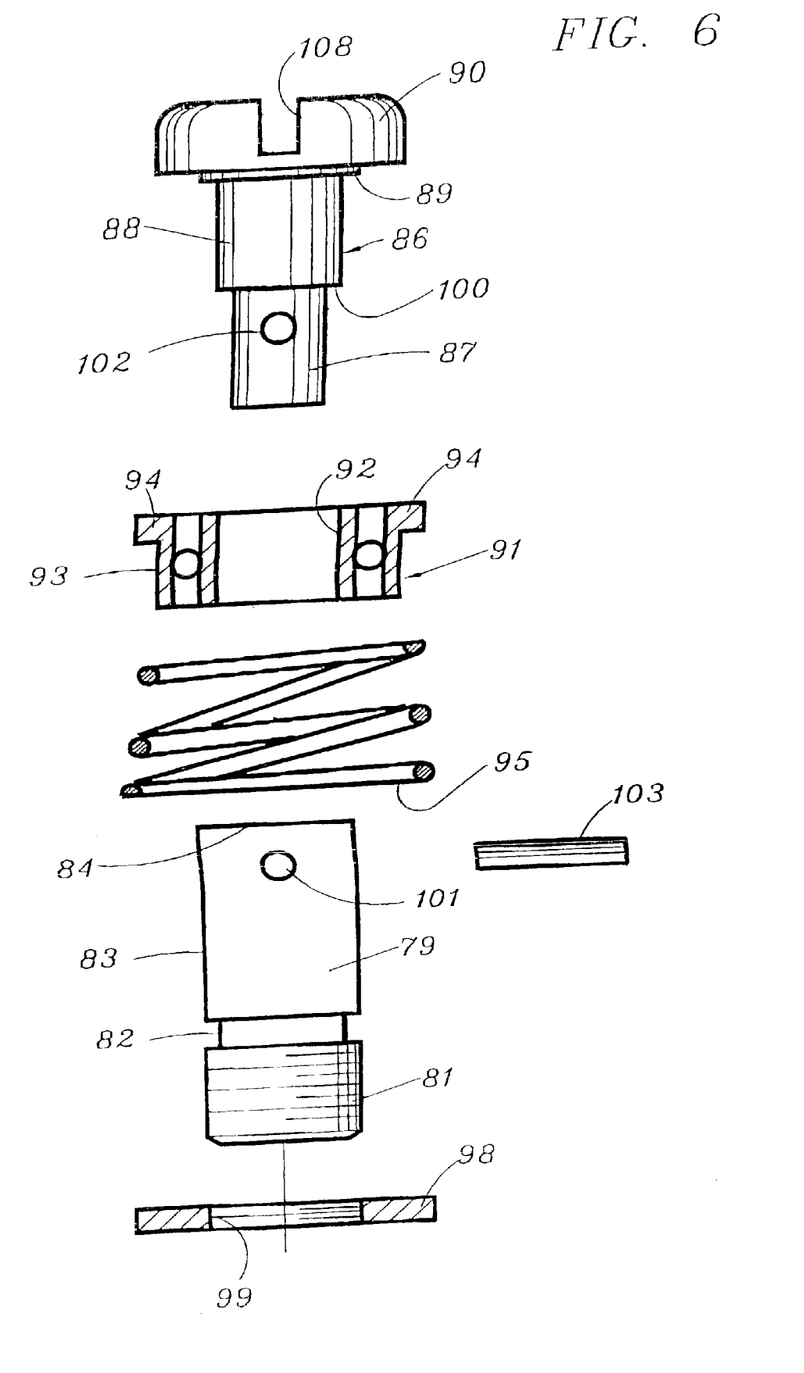
FIG. 6 is an exploded view of the assembly for rotatably securing the latch to the ring.

The present invention is shown in FIG. 5 and consists of a latch body 72 defining a pair of opposed, spaced apart walls 73 and 74 on which a pair of coaxial, shafts 75 and 76 are formed. Rollers, respectively 77 and 78 are rotatably mounted on the shafts 75 and 76. Rollers 77 and 78 may be mounted on the shafts 75 and 76 by ball bearings or with or without other friction reducing means.

Means (such as a mounting device) is provided for detachably and rotatably mounting the latch body 72 to the ring 80 consisting of a post 79 which is provided with external threads 81 on its lowermost end, a radially reduced portion 82 above the threads 81 and a radially enlarged portion 83 above the radially reduced portion 82. The post 79 can be threadably secured within a bore 83 in the ring 80.

The top 84 of the post 79 is provided with a bore 85 adapted to receive a pin 86. The pin 86 has a lower, radially reduced portion 87 and a radially enlarged portion 88 above the radially reduced portion 87. The radially enlarged portion 88 is cylindrical and has a smooth wall.

Immediately above the radially enlarged portion 88 there is a radially enlarged relatively thin, annular step 89. A slotted head 90 is formed immediately above the step 89.

When the latch is assembled, a ball bearing 91 is slidably mounted on the radially reduced portion 87 of the pin 86. The bearing 91 has an inner race 92 and an outer race 93 having a radially enlarged flange 94 at its top. A normally compressed coil spring 95 is mounted on the bearing 91 with its top engaged to the flange 94 and its bottom to the latch body 72 at the bottom of the spaced apart walls 73 and 74. The pin 86 is mounted on the post 79 by inserting the lowermost radially reduced portion 87 into the bore 85 in the top of the post 79 with the ball bearing 91 mounted on the radially enlarged portion 88 and the spring 95 engaged to the bottom of the flange 94 and a bottom 96 on the latch body 72.

The bottom 96 of the latch body 72 is provided with a transverse passage 97 through which the post 79 extends. A retainer 98 is mounted on the radially reduced portion 82 of the post 79 and is free to rotate thereon. The retainer 98 is provided with a central opening 99 which may be provided with internal threads dimensioned to engage the threads 81 at the bottom of the post 79. Alternatively, the retainer 98 may be a split washer.

When the radially reduced portion 87 of the pin 86 is seated in the bore 85 in the top of the post 79, the bottom 100 of the radially enlarged portion 88 of pin 86 engages the top of the post 79. In that position, a transverse shear pin-receiving bore 101 in the radially enlarged portion 83 of the post 79 becomes operationally allignable with a transverse bore 102 in the radially reduced portion 87 of the pin 86. A coupling pin 103 secures the pin 86 to the post 79.

The radially enlarged portion 88 of the pin 86 is axially dimensioned longer than the axial dimension of the ball bearing 91 such that when the pin 86 is mounted on the post 79, the bottom of the ball bearing 91 does not engage the top of the post 79. The inner race 92 of the ball bearing is free to rotate on the radially enlarged portion 88 of the pin 86.

In order to prevent hindering rotation of the latch body 72 on the post 79 both in general operation or should the inner race 92 of the ball bearing 91 fail to freely rotate or seize to the radially enlarged portion 88 of the pin 86, the step 89 on the pin 86 is radially dimensioned to extend only above the inner race 92. While the spring 95 resiliently biases the inner race against the step 89, the step 89 prevents the outer race from being biased as well. Should the outer race 93 of the ball bearing 91 freeze with respect to the inner race, the inner race is free to rotate on the radially enlarged portion 88 of the pin 86. Thus, a fail-safe mechanism is provided.

Concave concavities 104 and 105 are provided in the ring 80 and dimensioned with respect to each other such that when roller 77 is engaged to the ring 80 in concavity 104, roller 78 is not engaged to the ring 80 in concavity 105. Thus, the spring 95 resiliently biases the outer clamping portion 106 of roller 78 to the wafer 107.

The entire latch and post assembly can be detached from the ring 80 as a unit by simply inserting a screw driver in the slot 108 of the head 90 of pin 86 and a new latch as a unit screwed to the ring 80. All parts of the latch and bearing assembly remain intact as a unit.

If the ball bearing 91 has become damaged, it may be removed and replaced as a single unit by removing the retainer pin 103 and separating the pin 86 from the post 79. This also provides for separation of the spring 95.

While FIG. 5 does not show ball bearings mounting the rollers 77 and 78 to the shafts 75 and 76, they may be employed as well. Forms of such ball bearings are shown in U.S. Pat. No. 6,299,153.

Those skilled in the art will appreciate that the applications of the present invention are varied, and that the invention is described in preferred embodiments. Accordingly, equivalents, additions and modifications to the elements of the claims presented herein may be made without departing from the principles of the invention.

What is claimed is:

1. A latch for releasably holding a semiconductor wafer to a wafer supporting device comprising:
   a latch body having a transverse opening extending there through,
   a mounting device extending through the opening,
   a ball bearing having an inner and an outer race, mounted for rotation on the mounting device,
   a spacing device on the mounting device for engaging only the top of the inner race of the ball bearing,
   a biasing member engaged between the outer race of the ball bearing and the latch body biasing the inner race of the ball bearing against the spacing device.

2. The latch in accordance with claim 1, including a securing device on the bottom of the mounting device to secure the latch to a wafer supporting device.

3. The latch in accordance with claim 1, including a retainer device on the mounting device for resisting detachment of the mounting device from the latch body under the influence of the biasing member.

4. The latch for releasably securing a semiconductor wafer to wafer supporting means in accordance with any one of claims 1, 2 and 3, including
   a rolling device rotatably mounted on the latch body on opposite sides of the mounting device.

5. The latch for releasably securing a semiconductor wafer to the wafer supporting device in accordance with claim 1, in which the mounting device comprises,
   a post detachably engagable with the supporting device, and
   a pin detachably mounted to the top of the post.

6. The latch for releasably securing a semiconductor wafer to the wafer supporting device in accordance with claim 5, including
   a retainer device on the mounting device for resisting detachment of the mounting device from the latch body under the influence of the biasing member.

7. The latch for releasably securing a semiconductor wafer to the wafer supporting device in accordance with claim 6, including
   a rolling device rotatably mounted on the latch body on opposite sides of the mounting device.

8. The latch for releasably securing a semiconductor wafer to the wafer supporting device in accordance with claim 6, including
   threads on the bottom of the post for threadably engaging the post to the wafer supporting device, in which the retainer device is mounted on the post intermediate the threads and the latch body.

9. The latch for releasably securing a semiconductor wafer to the wafer supporting device in accordance with claim 1, in which
   the inner race is normally rotatable on the mounting device, and abuts and is urged against the spacing device by the biasing member, and
   the outer race is normally rotatable relative to the inner race, and is rotatable regardless its relative rotatability to the inner race.

10. The latch for releasably securing a semiconductor wafer to a wafer supporting device in accordance with claim 1 in which
    the mounting device can be detached from the wafer supporting device by rotating the mounting device from its end opposite the wafer supporting device.

11. The latch for releasably securing a semiconductor wafer to the wafer supporting device in accordance with claim 5, in which a coupling device is engagable to both the pin means and post to attach the pin to the post and prevent rotation of the pin with respect to the post.

12. The latch for releasably securing a semiconductor wafer to the wafer supporting device in accordance with claim 5, in which the post is provided with an internal recess communicating with the top of the post, a first portion on the bottom of the pin adapted to slidably seat within the recess in the top of the post, a radially enlarged second portion on the pin adjacent to the first portion, the ball bearing being rotatably mounted on the second portion, and a coupling device engagable with both the post and the first portion of the pin which prevents rotation of the pin with respect to the post.

13. The latch for releasably securing a semiconductor wafer to the wafer supporting means device in accordance with claim 12, including a radially enlarged step at the end of the second portion opposite the first portion engagable only with the top of the inner race of the ball bearing, a head on the pin on the side of the step opposite the second portion extending radially outwardly to a position above but spaced away from the outer race of the ball bearing.

14. The latch for releasably securing a semiconductor wafer to the wafer supporting device in accordance with claim 1, in which the biasing member is spring engaged to the ball bearing and the body portion of the latch.

15. The latch for releasably securing a semiconductor wafer to the wafer supporting device in accordance with claim 14, including a radially enlarged flange on the outer race of the ball bearing, the spring is engaged to the enlarged flange.

16. A latch for releasably holding a semiconductor wafer to a ring-support comprising:

latch body having a pair of spaced apart, opposing walls defining a recess open at the top of the body and a radially reduced transverse passage communicating with the recess and the bottom of the body and defining a bottom to the recess;

a post extending from the recess downwardly through the transverse passage in the body, the post having a blind passage in and communicating with its top;

a pin detachably mounted to the post, a coupling device engagable with both the pin and the post to prevent rotation of the pin with respect to the post, a first portion on the pin adapted to seat in the blind passage;

a radially enlarged second portion on the pin above the first portion;

a ball bearing mounted on the second portion having an inner race and an outer race, the inner race being rotatable on the second portion, a radially enlarged spacer device on the second portion of the pin opposite the first portion, a head on the pin on the side of the spacer means device opposite the second portion extending radially outwardly to a position above but spaced away from the outer race of the ball bearing, a radially extending flange on the outer race of the bearing;

a spring extending between the flange on the outer race of the ball bearing downwardly to the bottom of the recess in the latch body normally biasing the ball bearing against the spacer means device when the pin is mounted in the blind passage in the top of the post.

17. The latch for releasably holding a semiconductor wafer to a ring-support in accordance with claim 16 including a retainer device on the post for resisting detachment of the post from the latch body under the influence of the spring.

18. The latch for releasably holding a semiconductor wafer to a ring-support in accordance with claim 17 including a roller device rotatably mounted on the latch body on opposite sides of the recess in the latch body.

19. A latch for releasably holding a semiconductor wafer to a wafer supporting device comprising:

a latch body, a mounting device for rotatably mounting the latch body on the wafer supporting device, the mounting device including, a ball bearing having an inner race and an outer race, the inner race being secured to the mounting device, the outer race being rotatably secured to the inner race, a resilient member between the ball bearing and the latch body normally biasing the ball bearing away from the latch body, and a first retainer device on the mounting device for preventing the separation of the ball bearing from the mounting device.

20. The latch for releasably holding a semiconductor wafer to the wafer supporting device in accordance with claim 19, including a second retainer means device on the mounting means for preventing the latch body from separating from the mounting means device.

21. The latch for releasably holding a semiconductor wafer to the wafer supporting device in accordance with claim 19, in which the mounting device comprises a pin and a post, the post being detachably secured to the wafer supporting device the ball bearing being mounted on the pin, the pin and the post being detachably coupled to each other such that the post rotates with rotation of the pin.

22. The latch for releasably holding a semiconductor wafer to the wafer supporting device in accordance with claim 21, including a second retainer device attached to the mounting device for preventing the latch body from separating from the mounting device.

* * * * *

UNITED STATES PATENT AND TRADEMARK OFFICE
CERTIFICATE OF CORRECTION

PATENT NO. : 6,783,299 B2
DATED : August 31, 2004
INVENTOR(S) : Ovadia Meron and Dmitriy Genkin

It is certified that error appears in the above-identified patent and that said Letters Patent is hereby corrected as shown below:

Column 7,
Lines 1 and 19, delete "means"

Column 8,
Lines 10 and 45, delete "means"
Line 43, delete "means", two places

Signed and Sealed this

Ninth Day of November, 2004

JON W. DUDAS
*Director of the United States Patent and Trademark Office*